(12) United States Patent
Zambrano

(10) Patent No.: US 6,362,072 B1
(45) Date of Patent: Mar. 26, 2002

(54) PROCESS FOR REALIZING TRENCH STRUCTURES

(75) Inventor: Raffaele Zambrano, San Giovanni la Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/431,714

(22) Filed: Oct. 26, 1999

Related U.S. Application Data

(62) Division of application No. 08/625,875, filed on Apr. 1, 1996, now Pat. No. 6,001,705.

(30) Foreign Application Priority Data

Mar. 31, 1995 (EP) .............................................. 95830125

(51) Int. Cl.$^7$ .......................................... H01L 21/762
(52) U.S. Cl. ..................................... 438/421; 438/437
(58) Field of Search ................................. 438/421, 437, 438/FOR 227, FOR 438; 148/DIG. 73, DIG. 50

(56) References Cited

U.S. PATENT DOCUMENTS

| | | |
|---|---|---|
| 4,264,382 A | 4/1981 | Anantha et al. |
| 5,324,683 A | 6/1994 | Fitch et al. |
| 5,432,376 A | 7/1995 | Zambrano |

FOREIGN PATENT DOCUMENTS

| | | |
|---|---|---|
| EP | 0 166 141 A3 | 1/1986 |
| EP | 181188 * | 5/1986 |
| EP | 0 181 188 A3 | 5/1986 |
| EP | 0 232 748 A1 | 8/1987 |
| EP | 0 245 622 A2 | 11/1987 |
| EP | 0 296 754 A3 | 12/1988 |

(List continued on next page.)

OTHER PUBLICATIONS

Goto H. and K. Inayoshi, "Trench Isolation Schemes for Bipolar Devices: Benefits and Limiting Aspects," Proceedings of the 17$^{th}$ ESSDERC, Bologna, Sep. 1987, pp. 689–692.

Rapisarda, C. et al. "Reliable Deep Trench Isolation Scheme for High Density, High Performance Bipolar Applications," Isolation and Trench Technology Symposium, Proceedings of the 178$^{th}$ Electromechanical Society Meeting, Seattle, Oct. 1990, pp. 412–413.

Wolf, Stanley, "Silicon Processing For The VLSI Era" vol. II, Process Integration, Lattice Press, 1990, pp. 51–58.

Robb, F.Y. et al., "High Voltage Deep Trench Isolation Process Options," Isolation and Trench Technology Symposium, Proceedings of the 178$^{th}$ Electromechanical Society Meeting, Seattle, Oct. 1990, pp. 408–409.

*Primary Examiner*—George Fourson
(74) *Attorney, Agent, or Firm*—Lisa K. Jorgenson; Robert Iannucci; Seed IP Law Group PLLC

(57) ABSTRACT

A process for forming, on a semiconductor substrate, an isolation structure between two zones of an integrated circuit wherein active regions of electronic components integrated thereto have already been defined, comprises the steps of: defining an isolation region on a layer of silicon oxide overlying a silicon layer; selectively etching the silicon to provide the isolation region; growing thermal oxide over the interior surfaces of the isolation structure; depositing dielectric conformingly; and oxidizing the deposited dielectric.

13 Claims, 6 Drawing Sheets

| | U.S. PATENT DOCUMENTS | | |
|---|---|---|---|
| EP | 0 540 262 A2 | | 5/1993 |
| EP | 540262 | * | 5/1993 |
| JP | 59-65446 | | 4/1984 |
| JP | 59-172246 | | 9/1984 |
| JP | 60-20530 | | 2/1985 |
| JP | 60-604445 | | 4/1985 |
| JP | 60-123040 | * | 7/1985 |
| JP | 61-67933 | | 4/1986 |
| JP | 1-20635 | | 1/1989 |
| JP | 1-32646 | | 2/1989 |
| JP | 1-222457 | | 9/1989 |
| JP | 2030161 | | 1/1990 |
| JP | 2-119238 | * | 5/1990 |
| JP | 3-229443 | | 10/1991 |
| JP | 5347353 | | 12/1993 |
| JP | 6-69333 | | 3/1994 |

\* cited by examiner

PROCESS FOR REALIZING TRENCH STRUCTURES

CROSS-REFERENCE TO RELATED APPLICATION

This application is a divisional of allowed U.S. patent application No. 08/625,875, filed Apr. 1, 1996 and allowed on Jun. 9, 1999, now U.S. Pat. No. 6,001,705.

TECHNICAL FIELD

The present invention relates to a process for forming, on a semiconductor substrate, a dielectric isolation structure between two zones of an integrated circuit, wherein active regions of electronic components have already been defined.

The invention relates, in particular but not solely, to electronic devices having a driver circuit and one or more power transistors integrated monolithically thereto, and concerns the formation of a trench isolation structure. Reference will be made hereinafter to this specific application for convenience of illustration.

BACKGROUND OF THE INVENTION

As is well known, forming an isolation region between two zones of an integrated circuit establishes electrical separation therebetween, and is usually achieved by the interposition of an isolation structure.

One possible isolation structure of a known type is depicted in FIG. 1a, and is described in Patent Application EP 91830151.6, filed on Apr. 17, 1991 by the applicant, and in U.S. Pat. No. 5,432,376, which issued on Jul. 11, 1995 and is based on the EP application.

For simplicity, FIG. 1a shows a circuit including a single low-voltage driver transistor of the npn type and single power transistor, also of the npn type.

This known structure, as described in detail in the above-mentioned patent, uses a diffused zone 4 of the n type, called the junction isolation zone, which separates regions 30 and 31 of the p type to isolate the power stage from the driver circuit.

While being advantageous from several aspects, this solution has a drawback in that it is limiting of the breakdown voltage for the resultant components due to inherent features of the method used, which provides for different concentrations of the various dopants.

Also directed to isolate the power stage from the driver circuit is a second solution, illustrated in FIG. 1b, wherein a dielectric isolation region 14' is provided instead of the diffused region 4.

While achieving its objective, not even this second solution is devoid of drawbacks.

Most serious of such drawbacks is one inherent to the processing sequence used, on account of the isolation region being defined directly after growing the last epitaxial layer, and in any case before forming either the power or the control components. Due to the materials used to form the dielectric isolation region 14' having different expansion coefficients, during the high-temperature, typically above 800° C., thermal cycles required to form the active regions of the components, the monocrystalline silicon lattice is subjected to considerable stresses which may later be relieved in an unelastic manner by dislocations and other crystal defects likely to impair the circuit performance and functionality.

In general, a temperature below 700 degrees Celsius is often considered a low temperature, and a temperature above 800 degrees Celsius is often considered a high temperature.

This allows some processing steps which entail deposition of materials to be classified as low-temperature steps, whereas the oxidation and diffusion steps would be steps carried out at high temperatures.

However, this is but one example of an isolation scheme known as Deep Trench Isolation (DTI). Comprehensive reviews of known technological approaches are to be found in the references listed here below:

[1] H. Goto and K. Inayoshi, "Trench Isolation Schemes for Bipolar Devices: Benefits and Limiting Aspects," Proceedings of the 17th ESSDERC (Bologna, September 1987), 369–372;

[2] C. Rapisarda, R. Zambrano, F. Baroetto and P. J. Ward, "Reliable Deep Trench Isolation Scheme for High Density, High Performance Bipolar Applications," Isolation and Trench Technology Symposium (Seattle, October 1990), Proceedings of the 178th Electromechanical Society Meeting, 412–413; and

[3] F. Y. Robb et al., "High Voltage Deep Trench Isolation Process Options," Isolation and Trench Technology Symposium (Seattle, October 1990), Proceedings of the 178th Electromechanical Society Meeting, 408–409.

References [1] and [2] above deal with the application of the technique to high-performance bipolar devices.

To provide effective isolation, the trench should be extended through the n-type epitaxial layer, approximately 1 micron thick.

The depth attained by the isolation, with this approach, does not exceed 5 microns.

Also known is that, to achieve good planarization, the trench width should not exceed 2 microns, for otherwise, very thick layers of polycrystalline silicon, or polySi, would have to be deposited, resulting in decreased productivity and increased cost of the process.

Some problems connected with the extension of this technique to devices which are to operate at higher voltages are discussed in Reference [3] above.

It is emphasized there, for example, that the trench depth should be increased, because the epitaxial layers to be etched are thicker, being on the order of 15 to 25 microns thick; on the other hand, trenches with aspect ratii (ratio of trench depth to width) higher than 10 are difficult to make.

SUMMARY OF THE INVENTION

One object of the present invention is to provide a method of making a structure for isolating two zones of an integrated circuit, which can overcome the aforementioned limitations and/or drawbacks of prior art methods.

According to principles of the invention, the object is achieved by a process for forming, on a semiconductor substrate, a dielectric isolation structure between two zones of an integrated circuit where active regions of electronic components have been previously defined, which process is as outlined above and characterized in that it comprises the following steps of:

defining the isolation zone in the silicon oxide;

selectively etching the silicon;

growing thermal oxide over the interior surfaces of the isolation structure;

depositing conformingly; and oxidizing the deposited dielectric.

In this way, a dielectric isolation structure is obtained which can also be applied, in quite a straightforward manner, to devices intended for operation at voltages in excess of a few tens of volts.

More particularly, the invention provides for the isolation structure to be formed after the formation of the active zones of the components.

Advantageously, this sequential processing scheme allows the stresses built into the silicon, on account of the materials which enter the making of the isolation by high-temperature processes having different coefficients of thermal expansion, to be minimized.

Additional advantages come from the possibility of using, for the purpose of planarization, different materials for the dielectric ranging from polycrystalline silicon to deposited oxide layers and perhaps organic materials.

All this by virtue of the active zones of the components having been formed earlier, and the only steps left to complete the device being the definition of the contact areas and the steps of metallization and passivation.

It should be further noted that the isolation forming technique of this invention affords high productivity.

In fact, from information reported in Reference [3] above, it can be appreciated that productivity is a variable of the utmost importance.

With the method of this invention, productivity can be kept high at uniquely reduced costs.

Table 1 of Reference [3] can be altered by the addition of the following column to encompass information about our own solution, namely:

TABLE I

| etch equipment | wet etch |
| --- | --- |
| chemistry | KOH |
| etch rate | >1 micron/minute |
| throughput/cost (wafer/hour/$) | 100 wafers/hr/30K$ |
| si ox selectivity | 50:1 |
| trench shape | isotropic |
| comments | easily deeper than 25 microns |

That is, wet etch using KOH (potassium hydroxide), an etch rate of one micron per minute, and an hourly capacity of more than one hundred slices.

As can be gathered from Table I, the method of this invention allows isolation regions to be formed to a depth of upwards of 25 microns.

This depth value is often essential to the operation of circuits which contain one or more power transistors and a driver circuit operated at higher voltages than a few tens of volts.

BRIEF DESCRIPTION OF THE DRAWINGS

The features and advantages of the device according to the invention will be apparent from the following description of an embodiment thereof, given by way of non-limitative example with reference to the accompanying drawings.

DETAILED DESCRIPTION OF THE INVENTION

The process sequence which results in a first embodiment of the inventive structure being implemented, is illustrated schematically in FIGS. 2a–2d, not drawn to scale.

Figure 2A:
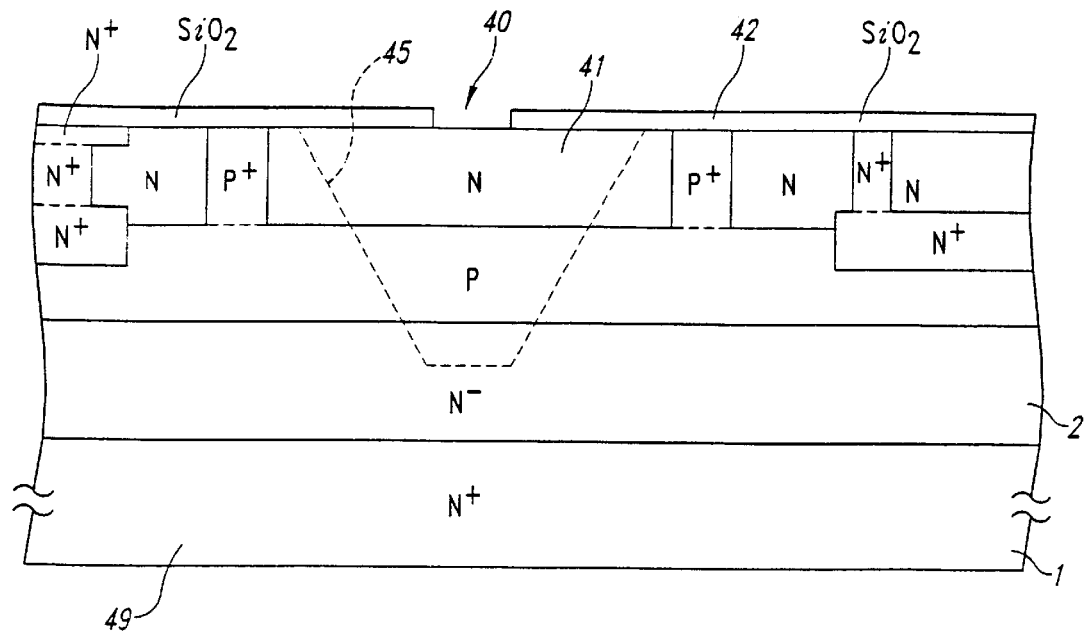
FIGS. 2a to 2d show successive steps in the making of the dielectric isolation structure according to the invention.

FIG. 2a is a vertical section view, enlarged but out of scale, of a semiconductor electronic device which has been formed with the active regions and an opening 40, through the oxide 42 provided on the device surface, within the region where the dielectric isolation structure 45 is to be formed.

Figure 2B:
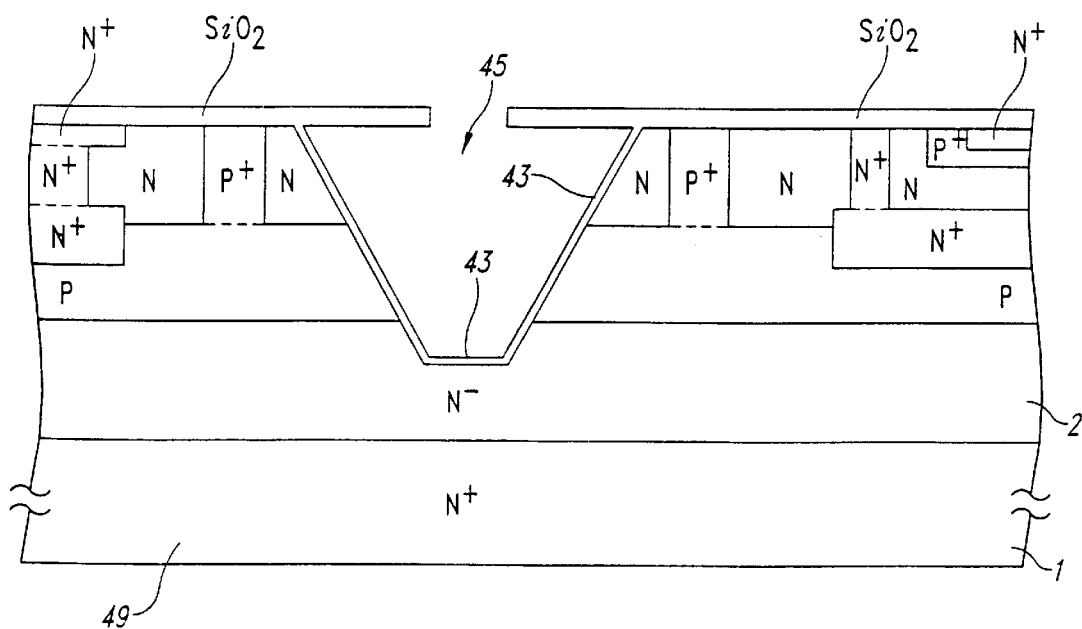

FIG. 2b is a view showing schematically the same device as in FIG. 2a, after the steps of wet etching the silicon underlying the oxide 41 by means of potassium hydroxide, KOH, and then growing the thermal oxide 43 have been completed.

Figure 2C:
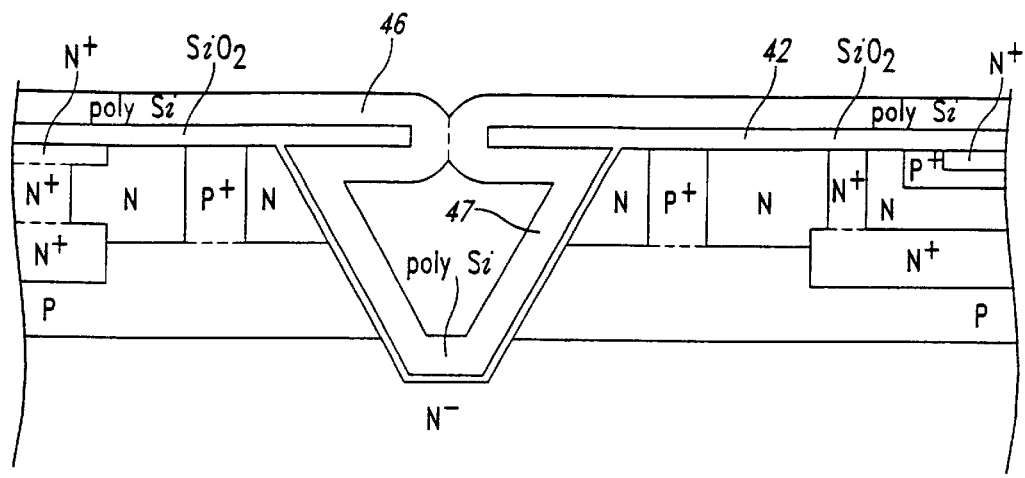

FIG. 2c is a schematic view of the device shown in FIG. 2b, having a layer of polycrystalline silicon, or polySi, 46 deposited thereon whose thickness is approximately one half the size of the opening 40 formed through the oxide 42. In one aspect of the invention, the polySi is undoped so that it is substantially nonconductive, and thus acts as a dielectric.

Figure 2D:
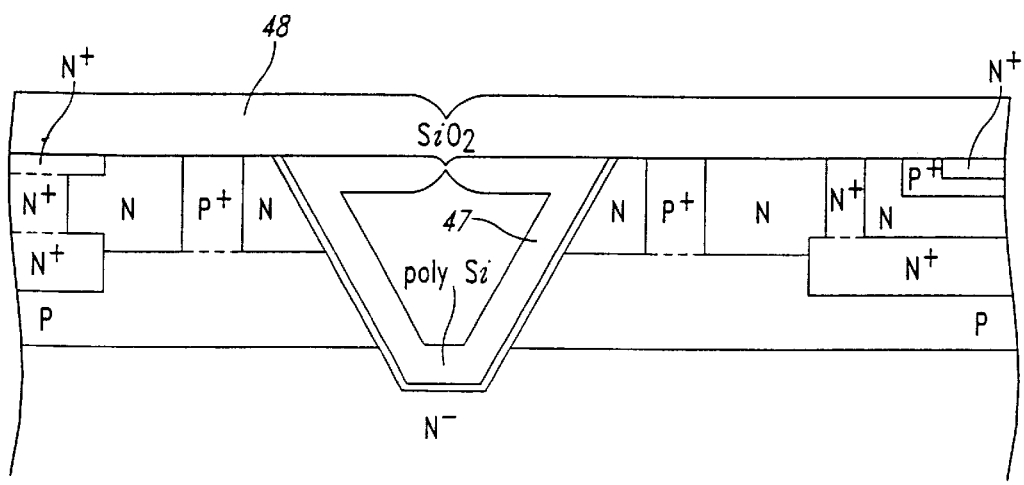

FIG. 2d is a schematic view of the device shown in FIG. 2c after the polySi 46 oxidation step.

The operations which lead to the formation of active regions of the device, namely the emitters and bases of power transistors, the emitters, bases and collectors of low-voltage transistors, isolation regions of the p type, and the collectors of power transistors, are quite the same as described in the aforementioned European Patent Application No. 91820151.6.

Figure 1A:
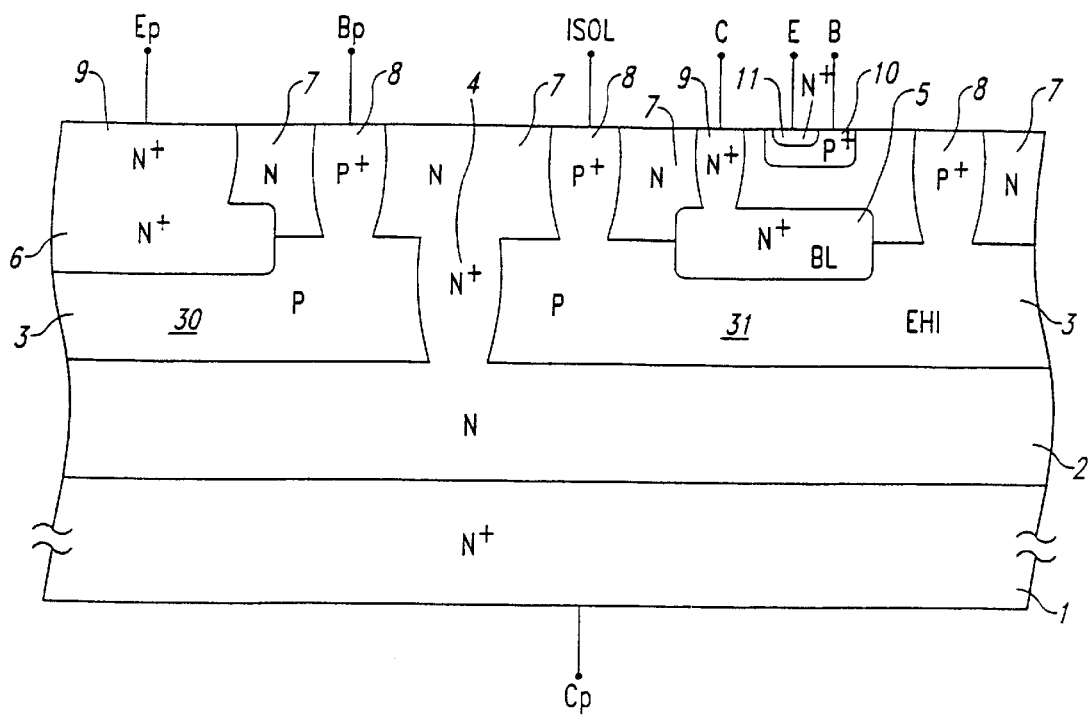
FIG. 1A shows an embodiment of a device with a junction type of isolation according to the prior art.
Figure 1B:
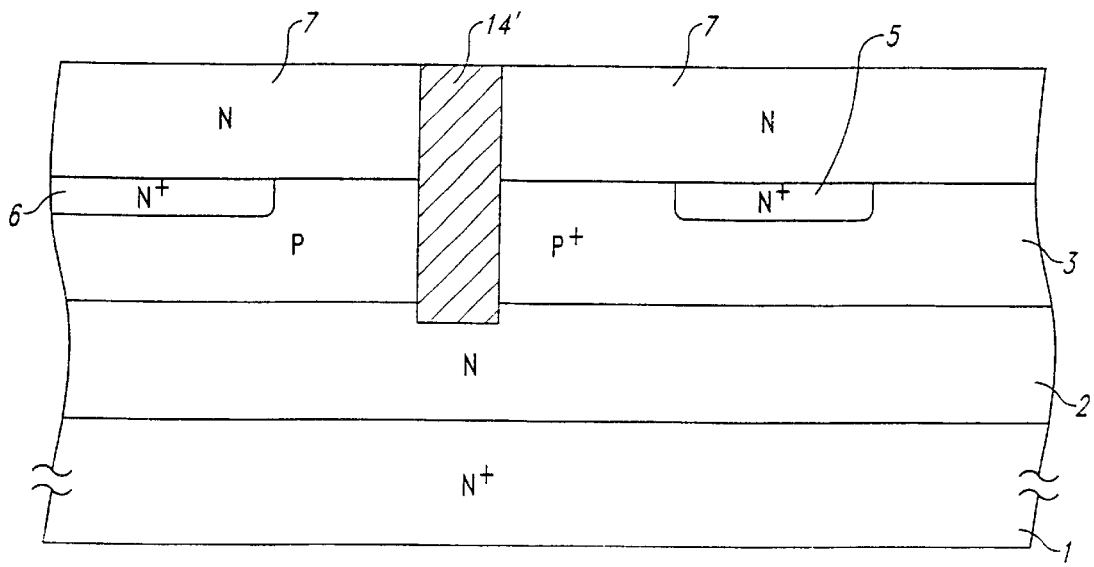
FIG. 1b shows an embodiment of a device with a dielectric type of isolation according to the prior art.

In relation to the sequence that will produce the structure shown in FIG. 1a, the operations for defining the diffused region 4 are omitted here. Referring to FIG. 2a, an opening 40 is instead provided through the silicon oxide 42.

The area of silicon 41 not covered with silicon oxide 42 is then etched to produce a trench which extends down to the epitaxial layer 2 of the N– type, which is in contact with the substrate 1 of N+ type.

The etching can be performed using a wet solution of potassium hydroxide (KOH) or by plasma etching. Alternatively to KOH, an aqueous solution of hydrofluoric acid and nitric acid ($HNO_3$) has been successfully employed at preferred percent concentrations in the ratio of 83:2:205.

A high ratio of the etch rates of the silicon 41 and the silicon oxide 42, i.e., a high etch selectivity, is preferred, but the etchant does not need to be anisotropic.

Once the etching step is completed, an oxidation is performed whereby a layer of thermal oxide 43 is grown over the walls of the trench 45.

Thermal oxide 43 is also grown on the bottom of the trench 45.

The process sequence includes, at this point, the deposition of a polySi layer 46. Alternatively, amorphous silicon, which in one aspect of the invention is also undoped so as to act as a dielectric, could be deposited.

The thickness of this layer is preferably equal to one half the spacing between the two portions of the oxide 42 which are present on the device surface, i.e., one half the size of the opening 40.

In this way, since the deposition is a conforming one, that is, the layer is grown evenly in a manner unaffected by topography, the portions of the polySi layer 46 grown on either side of the isolation region 42, will merge together at the surface, as shown in FIG. 2c, until they cover the opening 40. One acceptable technique for conformally depositing polySi is Chemical Vapor Deposition (CVD).

As a consequence of this, upon such merge, no increase in the thickness of the polySi layer 47 within the trench will occur, and further depositions of polySi can only lead to surfacial increase of the layer 46 thickness. Since the polySi deposition is carried out at low pressures of a few mTorrs, under a controlled atmosphere, no air can be trapped inside the trench 45. Thus, a potentially destructive condition is avoided where the structure is to undergo subsequent thermal processing at a high temperature.

Thereafter, a further oxidation step is carried out during which the surface polySi layer 46 is turned into an oxide that bonds to the underlying region 42 to form the surface oxide layer 48, as shown in FIG. 2d. The resultant structure is fully planarized.

The process is completed by the definition of the contact areas, the metallization required for interconnecting the various components, and the coating of the metallization with glass or some other passivating materials (none shown) in accordance with conventional methods of processing integrated electronic circuits. Referring to FIG. 2b, metallization of the underside 49 of the substrate is also contemplated for contacting the collector of the power transistor Cp, as shown in FIG. 1a.

It should be understood that many changes may be made unto the sequence just described without departing from the scope of the invention.

Figure 3A:
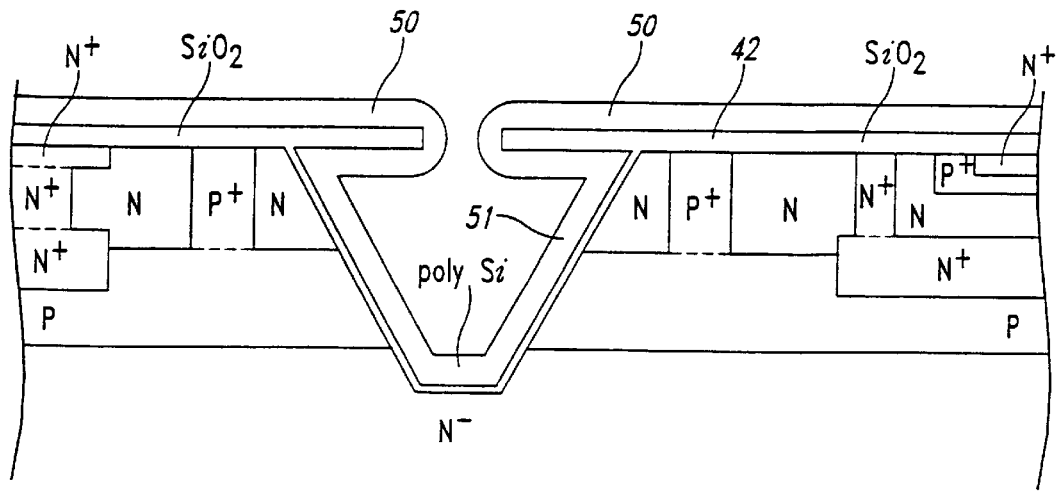
FIGS. 3a and 3b show successive steps in the making of a modified embodiment of the dielectric isolation structure according to the invention.

For example:

FIG. 3a is a schematic view of the same device as shown in FIG. 2c, but with the thickness of the deposited polySi being approximately one fourth of the opening size.

Figure 3B:
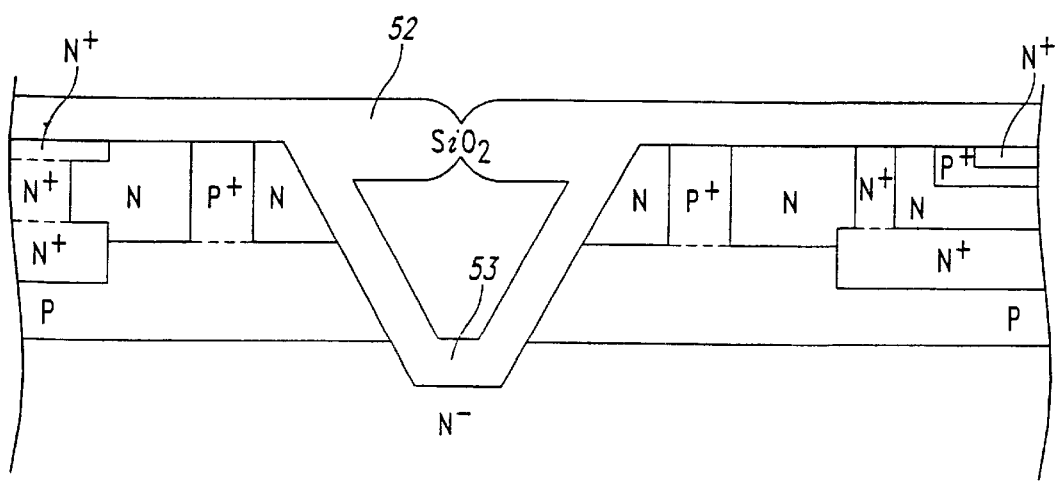

FIG. 3b is a schematic view of the device shown in FIG. 3a, after the oxidation of the polySi.

It can be seen in FIG. 3a that the two portions 50 of polySi do not merge with each other, but the increase in volume which accompanies the subsequent oxidation, and the outcome of which is shown in FIG. 3b, does result in the surface oxide layer 52, proceeding from the original oxide layer 42 and the polySi layer 50, to be continuous.

The oxidation also occurs within the trench, whose walls 51 become covered with a fairly thick oxide layer 53, as shown in FIG. 3b. It is preferable, in this case, that the resultant structure be subjected to no subsequent processing at higher temperatures than that used for the oxidation step.

An advantage of the embodiment shown in FIGS. 3a and 3b is that little or no polySi is present on the interior walls of the trench, which are in addition covered with a fairly thick oxide layer.

In this way, the well-recognized parasitic effects of a floating gate of polySi, i.e., of the gate electrode of a MOS transistor having the oxide grown on the trench walls as its gate dielectric and the buried isolation region of the p type as its channel region, can be suppressed.

Figure 4A:
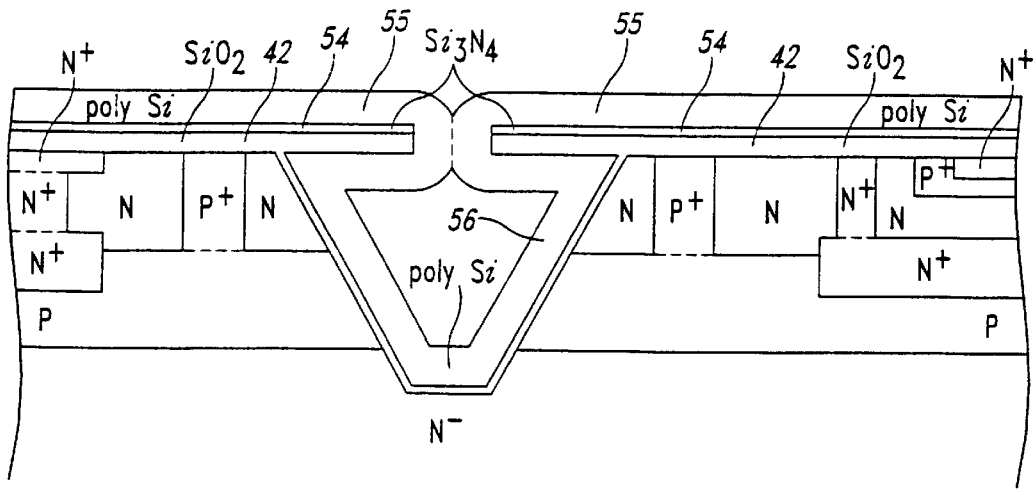
FIGS. 4a to 4c show successive steps in the making of another modified embodiment of the dielectric isolation structure according to the invention.

Let us consider now the following embodiments:

FIG. 4a is a schematic view of the same device as shown in FIG. 2c, where a layer of silicon nitride ($Si_3N_4$) has been deposited onto the initial oxide which covers the silicon in FIG. 2a before opening the isolation zone, followed by deposition of the polySi after the wet etching step.

Figure 4B:
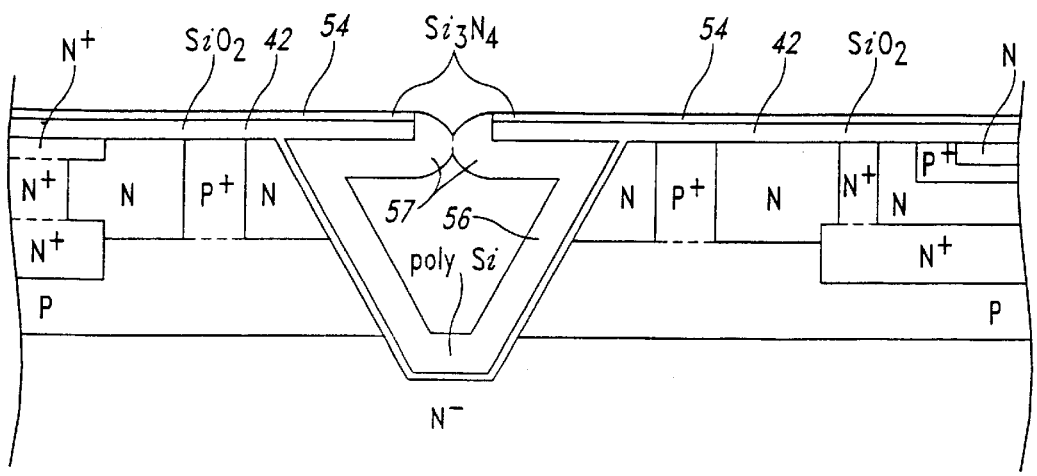

FIG. 4b is a schematic view of the same device as shown in FIG. 4a, after the etch-back of the polySi has been carried out.

Figure 4C:
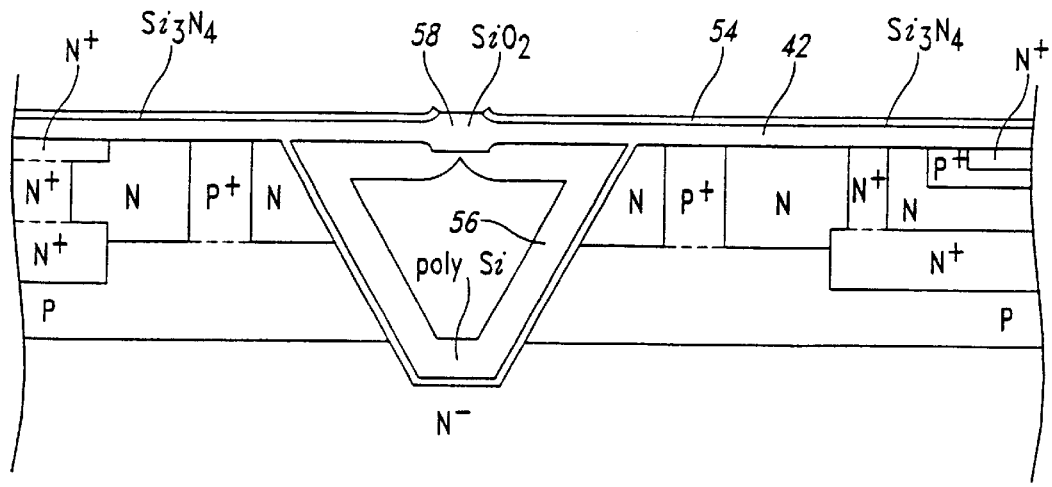

FIG. 4c is a schematic view of the same device as shown in FIG. 4b, after the oxidation of the remaining polySi.

Referring in particular to the example shown in FIG. 4a, another modified embodiment will now be described.

Over the surface oxide layer 42, a thin layer of silicon nitride ($Si_3N_4$) 54 may be deposited on which the polySi layer 55 will then be deposited.

This procedure is eminently useful where, in order to avoid increasing the thickness of the surface oxide during the subsequent oxidation step, one wishes to remove the polySi layer 55 to expose the layer 54 of silicon nitride ($Si_3N_4$). The outcome of this operation is clearly visible in FIG. 4c. In fact, the formation of the oxide layer 58 in the zone of the opening 40 will only be obtained, as is due to oxidation of the residual polySi 57 following removal of the polySi layer 55 by etch-back, as shown in FIG. 4b.

Figure 5:
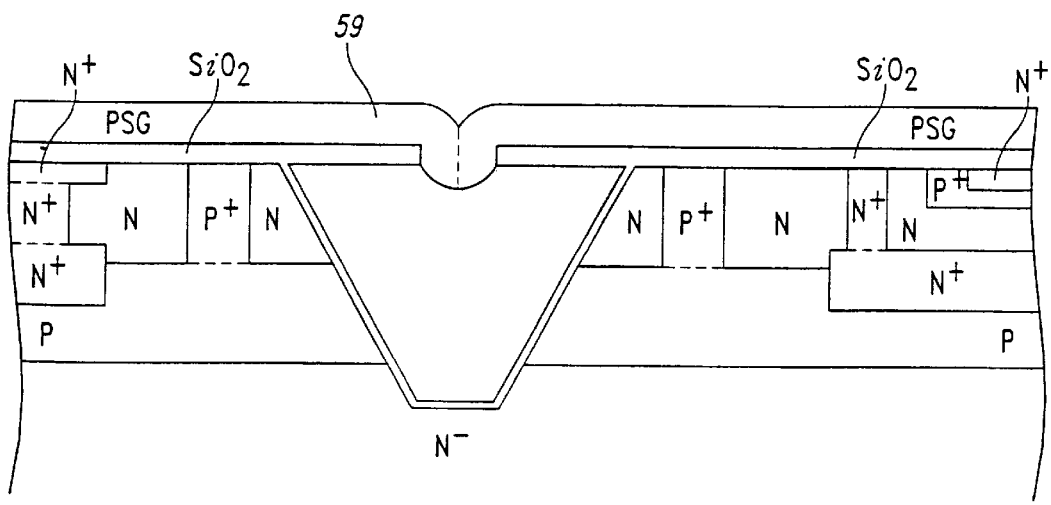
FIG. 5 shows a further modified embodiment of the inventive isolation structure.

FIG. 5 is a schematic view of the same device as shown in FIG. 2b, upon which has been deposited an unconforming layer of oxide.

In fact, in a further variation, the trench can be planarized without resorting to any deposition and oxidation of polySi.

Conforming layers of deposited oxide such as TEOS (tetra-ortho-siloxane), or unconforming layers such as the well-known PSG, BPSG, SOG can be used to produce the isolating layer which will subsequently allow metallization paths to be established for connecting the various active components.

The trench can also be planarized using organic materials (not shown), such as polyimide, and etch-back processes with or without a photoresist, as are well known.

It matters that in this case, the structure be subjected to no thermal treatments at temperatures above the curing temperature of the polyimide, to prevent degradation of the latter. This is a limitation of little significance to the invention since, as previously mentioned, all the active regions of the device have been defined, and to complete the processing, only the definition of the contacts and the metallization and passivation steps remain to be carried out.

An important point is that all those embodiments which do not provide for the deposition of polySi, or perhaps amorphous silicon, the aforementioned floating gates are not present.

In one aspect, the structure of this invention distinguishes itself from the prior art structures in that it utilizes the two portions of surface oxide for the subsequent planarization step.

In the instance of devices which contain one or more power transistors with monolithically integrated control logic, the device dimensions are such that the size of the isolation zone can be regarded as negligible. In fact, no definition of trenches with near-vertical walls, having high aspect ratii and no recesses, is required, and the presence of two "projecting" oxide portions from the silicon etching step is utilized instead as the start point for the dielectric deposition.

In the previously discussed FIGS. 2 to 5, the trench walls have been intentionally drawn at an angle of about 55 degrees from the normal to the surface, just as would be the case if an aqueous solution of potassium hydroxide (KOH) is used for etching the silicon.

Finally, it should be emphasized that in another aspect, the invention distinguishes itself from known solutions. The trench is defined subsequently to forming the active regions, that is after the heaviest thermal cycles have been completed. Accordingly, the active zones of the components have already been formed and the only steps left to complete the device processing are the definition of the contact area and the metallization and passivation steps.

This allows, as mentioned, of the optional use of organic dielectrics, e.g., polyimide, for the planarization, and reduces the stresses induced by materials having different expansion coefficients, with the added advantage of enhanced productivity.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A process for forming, on a semiconductor substrate having a silicon layer formed thereon, an isolation structure between two zones of an integrated circuit after active regions of electronic components integrated thereto have already been defined, the process comprising:

defining an isolation region on a layer of silicon oxide overlying the silicon layer by forming an opening in the layer of silicon oxide;

selectively etching the silicon to form the isolation region;

growing thermal oxide over the interior surfaces of the isolation region; and depositing dielectric unconformingly to seal the opening and to leave a substantial void inside of the isolation region.

2. A process according to claim 1 wherein the selective etching of the silicon is effected through the opening in the silicon oxide.

3. A process according to claim 1 wherein portions of the dielectric layer deposited within the opening have a combined thickness which is at least the width of the opening which defines the isolation region.

4. A process for forming, on a semiconductor substrate having a silicon layer formed thereon, an isolation structure between two zones of an integrated circuit after active regions of electronic components integrated thereto have already been defined, the process comprising:

defining an isolation region on a layer of silicon oxide overlying the silicon layer by forming an opening in the layer of silicon oxide;

selectively etching the silicon to form the isolation region;

growing thermal oxide over the interior surfaces of the isolation region; and depositing tetra-ethyl-ortho-silicate (TEOS) conformingly to seal the opening and to leave a significant void within the isolation region.

5. A process according to claim 4 wherein the selective etching of the silicon is effected through the opening in the silicon oxide.

6. A process according to claim 4 wherein the TEOS deposited conformingly has a thickness which is at least one half the width of the opening which defines the isolation region.

7. A process for forming, on a semiconductor substrate having a silicon layer formed therein, an isolation structure between two zones of an integrated circuit after active regions of electronic components integrated thereto have already been defined, the process comprising:

defining an isolation region on a layer of silicon oxide overlying the silicon layer by forming an opening in the layer of silicon oxide;

selectively etching the silicon to form the isolation region;

growing thermal oxide over the interior surfaces of the isolation region;

depositing organic dielectric to seal the opening and to leave a significant void in the isolation region; and etching back the deposited organic dielectric.

8. A process according to claim 7 wherein the selective etching of the silicon is effected through the opening in the silicon oxide.

9. A process according to claim 7 wherein:

the depositing comprises conformally depositing the organic dielectric; and the organic dielectric layer has a thickness which is at least one half the width of the opening which defines the isolation region.

10. A method for forming an isolation region in a semiconductor device that includes a layer of semiconductor material and a first insulator layer disposed thereon, the method comprising:

forming an opening through said first insulator layer to expose a portion of the semiconductor layer;

after an active region of a circuit component has been formed in the semiconductor layer, removing the exposed portion of said semiconductor layer to form a trench having walls and a bottom;

coating the walls and bottom of the trench with a second insulator layer; and forming a conforming insulator layer on the first insulator layer and in the opening to seal the opening and to leave a significant void within the trench.

11. The method of claim 10 wherein the coating comprises growing a thermal oxide on the walls and bottom of the trench to form the second insulator layer.

12. A method for forming an isolation region in a semiconductor device that includes a layer of semiconductor material and a first insulator layer disposed thereon, the method comprising:

forming an opening through said first insulator layer to expose a portion of the semiconductor layer;

after an active region of a circuit component has been formed in the semiconductor layer, removing the exposed portion of said semiconductor layer to form a trench having walls and a bottom;

coating the walls and bottom of the trench with a second insulator layer; and forming an unconforming insulator layer on the first insulator layer and in the opening to seal the opening and to leave a significant void within the trench.

13. A method for forming an isolation region in a semiconductor device that includes a layer of semiconductor material and a first insulator layer disposed thereon, the method comprising:

forming an opening through said first insulator layer to expose a portion of the semiconductor layer;

after an active region of a circuit component has been formed in the semiconductor layer, removing the exposed portion of said semiconductor layer to form a trench having walls and a bottom;

coating the walls and bottom of the trench with a second insulator layer; and forming a layer of organic material on the first insulator layer and in the opening to seal the opening and to leave a significant void within the trench.

* * * * *